(12) United States Patent
Chen

(10) Patent No.: US 7,847,619 B1
(45) Date of Patent: Dec. 7, 2010

(54) SERVO LOOP FOR WELL BIAS VOLTAGE SOURCE

(76) Inventor: Tien-Min Chen, 1049 Jacqueline Way, San Jose, CA (US) 95129

( * ) Notice: Subject to any disclaimer, the term of this patent is extended or adjusted under 35 U.S.C. 154(b) by 0 days.

(21) Appl. No.: 12/107,733

(22) Filed: Apr. 22, 2008

Related U.S. Application Data

(63) Continuation of application No. 11/591,431, filed on Oct. 31, 2006, now Pat. No. 7,362,165, which is a continuation of application No. 10/747,015, filed on Dec. 23, 2003, now Pat. No. 7,129,771.

(51) Int. Cl.
*G05F 1/10* (2006.01)
(52) U.S. Cl. ........................................ 327/536
(58) Field of Classification Search ............. 327/534, 327/535, 536, 537
See application file for complete search history.

(56) References Cited

U.S. PATENT DOCUMENTS

| | | | |
|---|---|---|---|
| 4,246,517 A | 1/1981 | Dakroub | |
| 4,471,290 A * | 9/1984 | Yamaguchi | 323/274 |
| 4,769,784 A | 9/1988 | Doluca et al. | |
| 4,798,974 A | 1/1989 | Reczek et al. | |
| 4,912,347 A | 3/1990 | Morris | |
| 4,929,621 A | 5/1990 | Manoury et al. | |
| 5,039,877 A | 8/1991 | Chern | |
| 5,086,501 A | 2/1992 | DeLuca et al. | |
| 5,113,088 A * | 5/1992 | Yamamoto et al. | 327/536 |
| 5,124,632 A | 6/1992 | Greaves | |
| 5,167,024 A | 11/1992 | Smith et al. | |
| 5,201,059 A | 4/1993 | Nguyen | |
| 5,204,863 A | 4/1993 | Saint-Joigny et al. | |
| 5,218,704 A | 6/1993 | Watts, Jr. et al. | |
| 5,230,055 A | 7/1993 | Katz et al. | |
| 5,239,652 A | 8/1993 | Seibert et al. | |
| 5,254,883 A | 10/1993 | Horowitz et al. | |
| 5,336,986 A | 8/1994 | Allman | |
| 5,347,172 A * | 9/1994 | Cordoba et al. | 327/536 |
| 5,386,135 A | 1/1995 | Nakazato et al. | |
| 5,394,026 A * | 2/1995 | Yu et al. | 327/536 |

(Continued)

FOREIGN PATENT DOCUMENTS

EP 0381021 8/1990

(Continued)

OTHER PUBLICATIONS

R. Jacob Baker, Harry W. Li and David E. Boyce. CMOS Circuit Design, Layout Simulation; IEEE Press; 1998.

(Continued)

*Primary Examiner*—Jeffrey S Sweizig

(57) ABSTRACT

A servo loop for a charge pump including comparator. A variable resistor and comparator are in series and couple the output of the charge pump to an enable input. A current source/sink coupled to the variable resistor provide a first input voltage to the comparator, with the second input of the comparator being coupled to ground or $V_{dd}$. A shunt circuit in parallel with the load at the output of the charge pump is also coupled to the output of the comparator. The charge pump and shunt are alternately enabled and disabled by the comparator to maintain a body-bias supply voltage. The servo loop may be configured to provide body-bias for NFETs or PFETs.

31 Claims, 7 Drawing Sheets

U.S. PATENT DOCUMENTS

| | | |
|---|---|---|
| 5,406,212 A | 4/1995 | Hashinaga et al. |
| 5,422,591 A | 6/1995 | Rastegar et al. |
| 5,422,806 A | 6/1995 | Chen et al. |
| 5,440,520 A | 8/1995 | Schutz et al. |
| 5,447,876 A | 9/1995 | Moyer et al. |
| 5,461,266 A | 10/1995 | Koreeda et al. |
| 5,483,434 A | 1/1996 | Seesink |
| 5,495,184 A | 2/1996 | Des Rosiers et al. |
| 5,502,838 A | 3/1996 | Kikinis |
| 5,506,541 A | 4/1996 | Herndon |
| 5,511,203 A | 4/1996 | Wisor et al. |
| 5,519,309 A | 5/1996 | Smith |
| 5,560,020 A | 9/1996 | Nakatani et al. |
| 5,592,173 A | 1/1997 | Lau et al. |
| 5,682,093 A | 10/1997 | Kivela |
| 5,692,204 A | 11/1997 | Rawson et al. |
| 5,694,072 A * | 12/1997 | Hsiao et al. ............... 327/537 |
| 5,717,319 A | 2/1998 | Jokinen |
| 5,719,800 A | 2/1998 | Mittal et al. |
| 5,727,208 A | 3/1998 | Brown |
| 5,744,996 A * | 4/1998 | Kotzle et al. ............... 327/534 |
| 5,745,375 A | 4/1998 | Reinhardt et al. |
| 5,752,011 A | 5/1998 | Thomas et al. |
| 5,754,869 A | 5/1998 | Holzhammer et al. |
| 5,757,171 A | 5/1998 | Babcock |
| 5,778,237 A | 7/1998 | Yamamoto et al. |
| 5,781,060 A | 7/1998 | Sugawara |
| 5,812,860 A | 9/1998 | Horden et al. |
| 5,815,724 A | 9/1998 | Mates |
| 5,818,290 A | 10/1998 | Tsukada |
| 5,825,674 A | 10/1998 | Jackson |
| 5,838,189 A | 11/1998 | Jeon |
| 5,842,860 A | 12/1998 | Funt |
| 5,848,281 A | 12/1998 | Smalley et al. |
| 5,884,049 A | 3/1999 | Atkinson |
| 5,894,577 A | 4/1999 | MacDonald et al. |
| 5,900,773 A | 5/1999 | Susak |
| 5,920,226 A * | 7/1999 | Mimura ............... 327/537 |
| 5,923,545 A | 7/1999 | Nguyen |
| 5,929,621 A | 7/1999 | Angelici et al. |
| 5,933,649 A | 8/1999 | Lim et al. |
| 5,940,020 A | 8/1999 | Ho |
| 5,940,785 A | 8/1999 | Georgiou et al. |
| 5,940,786 A | 8/1999 | Steeby |
| 5,952,871 A | 9/1999 | Jeon |
| 5,974,557 A | 10/1999 | Thomas et al. |
| 5,986,947 A | 11/1999 | Choi et al. |
| 5,996,083 A | 11/1999 | Gupta et al. |
| 5,996,084 A | 11/1999 | Watts |
| 5,999,040 A | 12/1999 | Do et al. |
| 6,006,169 A | 12/1999 | Sandhu et al. |
| 6,018,264 A * | 1/2000 | Jin ............... 327/536 |
| 6,021,500 A | 2/2000 | Wang et al. |
| 6,035,407 A | 3/2000 | Gebara et al. |
| 6,047,248 A | 4/2000 | Georgiou et al. |
| 6,048,746 A | 4/2000 | Burr |
| 6,075,404 A * | 6/2000 | Shindoh et al. ............... 327/537 |
| 6,078,084 A | 6/2000 | Nakamura et al. |
| 6,078,319 A | 6/2000 | Bril et al. |
| 6,087,820 A | 7/2000 | Houghton et al. |
| 6,087,892 A | 7/2000 | Burr |
| 6,091,283 A | 7/2000 | Murgula et al. |
| 6,100,751 A | 8/2000 | De et al. |
| 6,118,306 A | 9/2000 | Orton et al. |
| 6,119,241 A | 9/2000 | Michail et al. |
| 6,141,762 A | 10/2000 | Nicol et al. |
| 6,157,092 A | 12/2000 | Hofmann |
| 6,202,104 B1 | 3/2001 | Ober |
| 6,215,235 B1 | 4/2001 | Osamura |
| 6,216,235 B1 | 4/2001 | Thomas et al. |
| 6,218,708 B1 | 4/2001 | Burr |
| 6,226,335 B1 | 5/2001 | Prozorov |
| 6,229,379 B1 | 5/2001 | Okamoto |
| 6,232,830 B1 | 5/2001 | Fournel |
| 6,259,612 B1 * | 7/2001 | Itoh ............... 363/60 |
| 6,272,642 B2 | 8/2001 | Pole, II et al. |
| 6,279,048 B1 | 8/2001 | Fadavi-Ardekani et al. |
| 6,281,716 B1 | 8/2001 | Mihara |
| 6,303,444 B1 | 10/2001 | Burr |
| 6,304,824 B1 | 10/2001 | Bausch et al. |
| 6,305,407 B1 | 10/2001 | Selby |
| 6,311,287 B1 | 10/2001 | Dischler et al. |
| 6,314,522 B1 | 11/2001 | Chu et al. |
| 6,320,453 B1 | 11/2001 | Manning |
| 6,337,593 B1 | 1/2002 | Mizuno et al. |
| 6,345,362 B1 | 2/2002 | Bertin et al. |
| 6,345,363 B1 | 2/2002 | Levy-Kendler |
| 6,347,379 B1 | 2/2002 | Dai et al. |
| 6,370,046 B1 | 4/2002 | Nebrigic et al. |
| 6,373,323 B2 * | 4/2002 | Kuroda ............... 327/536 |
| 6,373,325 B1 | 4/2002 | Kuriyama |
| 6,378,081 B1 | 4/2002 | Hammond |
| 6,388,432 B2 | 5/2002 | Uchida |
| 6,415,388 B1 | 7/2002 | Browning et al. |
| 6,424,203 B1 | 7/2002 | Bayadroun |
| 6,424,217 B1 | 7/2002 | Kwong |
| 6,425,086 B1 | 7/2002 | Clark et al. |
| 6,427,211 B2 | 7/2002 | Watts, Jr. |
| 6,442,746 B1 | 8/2002 | James et al. |
| 6,457,135 B1 | 9/2002 | Cooper |
| 6,466,077 B1 | 10/2002 | Miyazaki et al. |
| 6,469,573 B2 | 10/2002 | Kanda et al. |
| 6,476,632 B1 | 11/2002 | La Rosa et al. |
| 6,477,654 B1 | 11/2002 | Dean et al. |
| 6,486,729 B2 | 11/2002 | Imamiya |
| 6,487,668 B2 | 11/2002 | Thomas et al. |
| 6,489,224 B1 | 12/2002 | Burr |
| 6,496,027 B1 | 12/2002 | Sher et al. |
| 6,496,057 B2 | 12/2002 | Wada et al. |
| 6,510,400 B1 | 1/2003 | Moriyama |
| 6,510,525 B1 | 1/2003 | Nookala et al. |
| 6,513,124 B1 | 1/2003 | Furuichi et al. |
| 6,518,828 B2 | 2/2003 | Seo et al. |
| 6,519,706 B1 | 2/2003 | Ogoro |
| 6,529,421 B1 | 3/2003 | Marr et al. |
| 6,531,912 B2 | 3/2003 | Katou |
| 6,563,371 B2 | 5/2003 | Buckley, III et al. |
| 6,570,371 B1 | 5/2003 | Volk |
| 6,574,577 B2 | 6/2003 | Stapleton et al. |
| 6,574,739 B1 | 6/2003 | Kung et al. |
| 6,600,346 B1 | 7/2003 | Macaluso |
| 6,617,656 B2 | 9/2003 | Lee et al. |
| 6,642,774 B1 * | 11/2003 | Li ............... 327/536 |
| 6,675,360 B1 | 1/2004 | Cantone et al. |
| 6,677,643 B2 | 1/2004 | Iwamoto et al. |
| 6,700,434 B2 * | 3/2004 | Fujii et al. ............... 327/534 |
| 6,731,221 B1 | 5/2004 | Dioshongh et al. |
| 6,737,909 B2 | 5/2004 | Jaussi et al. |
| 6,741,118 B2 | 5/2004 | Uchikoba et al. |
| 6,771,115 B2 * | 8/2004 | Nakano ............... 327/536 |
| 6,774,705 B2 | 8/2004 | Miyazaki et al. |
| 6,784,722 B2 | 8/2004 | Tang et al. |
| 6,791,146 B2 | 9/2004 | Lai et al. |
| 6,791,212 B2 * | 9/2004 | Pulvirenti et al. ............... 307/113 |
| 6,792,379 B2 | 9/2004 | Ando |
| 6,803,633 B2 | 10/2004 | Mergens et al. |
| 6,809,968 B2 | 10/2004 | Marr et al. |
| 6,865,116 B2 | 3/2005 | Kim et al. |
| 6,882,172 B1 | 4/2005 | Suzuki et al. |
| 6,889,331 B2 | 5/2005 | Soerensen et al. |
| 6,906,582 B2 | 6/2005 | Kase et al. |
| 6,917,240 B2 | 7/2005 | Trafton et al. |
| 6,922,783 B2 | 7/2005 | Knee et al. |
| 6,927,620 B2 * | 8/2005 | Senda ............... 327/536 |

| | | | |
|---|---|---|---|
| 6,936,898 B2 | 8/2005 | Pelham et al. | |
| 6,967,522 B2 | 11/2005 | Chandrakasan et al. | |
| 6,986,068 B2 | 1/2006 | Togawa | |
| 6,992,508 B2 | 1/2006 | Chow | |
| 7,012,461 B1 | 3/2006 | Chen et al. | |
| 7,030,681 B2 | 4/2006 | Yamazaki et al. | |
| 7,100,061 B2 | 8/2006 | Halepete et al. | |
| 7,119,604 B2 | 10/2006 | Chih | |
| 7,120,804 B2 | 10/2006 | Tschanz et al. | |
| 7,228,242 B2 | 6/2007 | Read et al. | |
| 7,562,233 B1 | 7/2009 | Sheng et al. | |
| 2001/0028577 A1 | 10/2001 | Sung et al. | |
| 2002/0011650 A1 | 1/2002 | Nishizawa et al. | |
| 2002/0026597 A1 | 2/2002 | Dai et al. | |
| 2002/0067638 A1 | 6/2002 | Kobayashi et al. | |
| 2002/0073348 A1 | 6/2002 | Tani | |
| 2002/0083356 A1 | 6/2002 | Dai | |
| 2002/0087219 A1 | 7/2002 | Dai | |
| 2002/0087896 A1 | 7/2002 | Cline et al. | |
| 2002/0116650 A1 | 8/2002 | Halepete et al. | |
| 2002/0130701 A1 | 9/2002 | Kleveland | |
| 2002/0138778 A1 | 9/2002 | Cole et al. | |
| 2002/0140494 A1 | 10/2002 | Thomas et al. | |
| 2002/0194509 A1 | 12/2002 | Plante et al. | |
| 2003/0006590 A1 | 1/2003 | Aoki et al. | |
| 2003/0036876 A1 | 2/2003 | Fuller, III et al. | |
| 2003/0065960 A1 | 4/2003 | Rusu et al. | |
| 2003/0071657 A1 | 4/2003 | Soerensen et al. | |
| 2003/0074591 A1 | 4/2003 | McClendon et al. | |
| 2003/0098736 A1 | 5/2003 | Uchikoba et al. | |
| 2003/0189465 A1 | 10/2003 | Abadeer et al. | |
| 2004/0010330 A1 | 1/2004 | Chen | |
| 2004/0025061 A1 | 2/2004 | Lawrence | |
| 2004/0073821 A1 | 4/2004 | Naveh et al. | |
| 2004/0103330 A1 | 5/2004 | Bonnett | |
| 2004/0108881 A1 | 6/2004 | Bokui et al. | |
| 2004/0246044 A1 | 12/2004 | Myono et al. | |
| 2005/0225376 A1 | 10/2005 | Kin Law | |
| 2007/0283176 A1 | 12/2007 | Tobias et al. | |

FOREIGN PATENT DOCUMENTS

| | | |
|---|---|---|
| EP | 0474963 | 3/1992 |
| EP | 0501655 | 9/1992 |
| EP | 0504655 | 9/1992 |
| EP | 0624909 | 11/1994 |
| EP | 0978781 | 4/2003 |
| EP | 1398639 | 3/2004 |
| JP | 63223480 | 9/1988 |
| JP | 04114365 | 4/1992 |
| JP | 409185589 | 7/1997 |
| JP | 11-118845 | 4/1999 |
| JP | 2000172383 | 10/2001 |
| JP | 2001345693 | 12/2001 |
| JP | 2003324735 | 11/2003 |
| WO | 0127728 | 4/2001 |
| WO | 0238828 | 5/2002 |

OTHER PUBLICATIONS

Non Final Office Action, Mail Date Mar. 20, 2008; U.S. Appl. No. 10/747,016.
Non Final Office Action, Mail Date May 16, 2007; U.S. Appl. No. 10/747,016.
Non Final Office Action, Mail Date Jun. 23, 2006; U.S. Appl. No. 10/747,016.
Non Final Office Action, Mail Date Nov. 18, 2005; U.S. Appl. No. 10/747,016.
Non Final Office Action, Mail Date Dec. 22, 2004; U.S. Appl. No. 10/747,016.
Notice of Allowance, Mail Date Mar. 13, 2009; U.S. Appl. No. 10/747,016.
Notice of Allowance, Mail Date Aug. 20, 2009; U.S. Appl. No. 10/747,016.
Notice of Allowance, Mail Date Aug. 27, 2008; U.S. Appl. No. 10/747,016.
Notice of Allowance, Mail Date Dec. 18, 2008; U.S. Appl. No. 10/747,016.
Final Office Action, Mail Date Jan. 12, 2009; U.S. Appl. No. 10/746,539.
Final Office Action, Mail Date Apr. 2, 2008; U.S. Appl. No. 10/746,539.
Final Office Action, Mail Date Apr. 11, 2005; U.S. Appl. No. 10/746,539.
Final Office Action, Mail Date Jun. 15, 2007; U.S. Appl. No. 10/746,539.
Final Office Action, Mail Date Aug. 31, 2006; U.S. Appl. No. 10/746,539.
Final Office Action, Mail Date Dec. 19, 2005; U.S. Appl. No. 10/746,539.
Non Final Office Action, Mail Date Jan. 23, 2007; U.S. Appl. No. 10/746,539.
Non Final Office Action, Mail Date Apr. 11, 2006; U.S. Appl. No. 10/746,539.
Non Final Office Action, Mail Date Jun. 2, 2009; U.S. Appl. No. 10/746,539.
Non Final Office Action, Mail Date Aug. 11, 2005; U.S. Appl. No. 10/746,539.
Non Final Office Action, Mail Date Aug. 25, 2008; U.S. Appl. No. 10/746,539.
Non Final Office Action, Mail Date Nov. 30, 2007; U.S. Appl. No. 10/746,539.
Non Final Office Action, Mail Date Dec. 10, 2004; U.S. Appl. No. 10/746,539.
Non Final Office Action, Mail Date Dec. 22, 2004; U.S. Appl. No. 10/747,022.
Notice of Allowance, Mail Date Sep. 28, 2005; U.S. Appl. No. 10/747,022.
Final Office Action, Mail Date Feb. 23, 2009; U.S. Appl. No. 11/358,482.
Final Office Action, Mail Date May 23, 2008; U.S. Appl. No. 11/358,482.
Non Final Office Action, Mail Date Jul. 23, 2009; U.S. Appl. No. 11/358,482.
Non Final Office Action, Mail Date Oct. 14, 2008; U.S. Appl. No. 11/358,482.
Non Final Office Action, Mail Date Dec. 26, 2007; U.S. Appl. No. 11/358,482.
Final Office Action, Mail Date Aug. 23, 2007; U.S. Appl. No. 11/358,482.
Non Final Office Action, Mail Date Apr. 4, 2007; U.S. Appl. No. 11/358,482.
Non Final Office Action, Mail Date Feb. 3, 2009; U.S. Appl. No. 10/874,407.
Non Final Office Action, Mail Date Aug. 9, 2006; U.S. Appl. No. 10/874,407.
Notice of Allowance, Mail Date Jul. 13, 2009; U.S. Appl. No. 10/874,407.
Notice of Allowance, Mail Date Oct. 1, 2008; U.S. Appl. No. 10/874,407.
Non Final Office Action, Mail Date Jun. 20, 2007; U.S. Appl. No. 10/874,772.
Non Final Office Action, Mail Date Sep. 6, 2006; U.S. Appl. No. 10/874,772.
Notice of Allowance, Mail Date Apr. 2, 2008; U.S. Appl. No. 10/874,772.
Notice of Allowance, Mail Date Nov. 20, 2007; U.S. Appl. No. 10/874,772.
Non Final Office Action, Mail Date Jun. 20, 2007; U.S. Appl. No. 10/874,772.
"Computer Software", Wikipedia, http://en.wikipedia.org/wiki/software, retrieved May 2, 2007.
Final Office Action, Mail Date Dec. 7, 2006; U.S. Appl. No. 10/747,016.
"Shmoo plotting: the black art of IC testing", (Baker et al.), IEEE design & test of computers, pp. 90-97, Jul. 1997 [XP783305].

Desai et al., "Sizing of Clock Distribution Networks for High Performance CPU Chips", Digital Equipment Corporation, Hudson, MA, pp. 389-394, 1996.

Hsu, Jui-Ching, "Fabrication of Single Walled Carbon Nanotube (SW-CNT) Cantilevers for Chemical Sensing", M. Sc Thesis, Louisiana State University, Dec. 2007.

Merriam-webster's Collegiate Dictionary, tenth edition, pp. 252 and 603 (Merriam-Webster Inc., Springfield, Mass, USA).

Oner, H. et al., "A compact monitoring circuit for real-time on-chip diagnosis of hot-carrier induced degradation", Microelectronic Test Structures, 1997. IICMTS 1997. Proceedings, IEEE International Conference on Monterey, CA, Mar. 17-20, 1997, pp. 72-76.

Advisory Action; Mail Date May 7, 2007; U.S. Appl. No. 10/334,918.

Final Office Action, Mail Date Jan. 31, 2007; U.S. Appl. No. 10/334,918.

Final Office Action, Mail Date Feb. 15, 2006; U.S. Appl. No. 10/334,918.

Final Office Action, Mail Date Oct. 30, 2006; U.S. Appl. No. 10/334,918.

Final Office Action, Mail Date Nov. 26, 2008; U.S. Appl. No. 10/334,918.

Non Final Rejection, Mail Date Feb. 18, 2009; U.S. Appl. No. 10/334,918.

Non Final Rejection, Mail Date May 13, 2008; U.S. Appl. No. 10/334,918.

Non Final Rejection, Mail Date May 15, 2006; U.S. Appl. No. 10/334,918.

Non Final Rejection, Mail Date Jun. 13, 2006; U.S. Appl. No. 10/334,918.

Final Office Action, Mail Date Jan. 6, 2009; U.S. Appl. No. 10/334,919.

Final Office Action, Mail Date Feb. 21, 2007; U.S. Appl. No. 10/334,919.

Final Office Action, Mail Date Mar. 9, 2006; U.S. Appl. No. 10/334,919.

Non Final Rejection, Mail Date May 15, 2007; U.S. Appl. No. 10/334,919.

Non Final Rejection, Mail Date May 28, 2009; U.S. Appl. No. 10/334,919.

Non Final Rejection, Mail Date Jun. 13, 2005; U.S. Appl. No. 10/334,919.

Non Final Rejection, Mail Date Jul. 21, 2008; U.S. Appl. No. 10/334,919.

Non Final Rejection, Mail Date Aug. 7, 2006; U.S. Appl. No. 10/334,919.

Non Final Rejection, Mail Date Nov. 23, 2007; U.S. Appl. No. 10/334,919.

Notice of Allowance, Mail Date Jan. 5, 2005; U.S. Appl. No. 10/334,748.

Notice of Allowance, Mail Date Aug. 10, 2006; U.S. Appl. No. 10/334,748.

Notice of Allowance, Mail Date Sep. 22, 2005; U.S. Appl. No. 10/334,748.

Non Final Office Action, Mail Date Jun. 24, 2004; U.S. Appl. No. 10/334,748.

Non Final Office Action, Mail Date Aug. 21, 2007; U.S. Appl. No. 10/951,835.

Restriction Requirement, Mail Date Mar. 19, 2007; U.S. Appl. No. 10/951,835.

Restriction Requirement, Mail Date May 28, 2008; U.S. Appl. No. 11/810,516.

Final Office Action, Mail Date Oct. 30, 2007; U.S. Appl. No. 10/747,016.

Final Office Action, Mail Date Apr. 13, 2005; U.S. Appl. No. 10/747,015.

Final Office Action, Mail Date Dec. 2, 2005; U.S. Appl. No. 10/747,015.

Non Final Office Action, Mail Date Apr. 18, 2006; U.S. Appl. No. 10/747,015.

Non Final Office Action, Mail Date Jul. 29, 2005; U.S. Appl. No. 10/747,015.

Non Final Office Action, Mail Date Dec. 23, 2004; U.S. Appl. No. 10/747,015.

Notice of Allowance, Mail Date Jun. 21, 2006; U.S. Appl. No. 10/747,015.

Non Final Office Action, Mail Date Aug. 1, 2007; U.S. Appl. No. 11/591,431.

Notice of Allowance, Mail Date Nov. 23, 2007; U.S. Appl. No. 11/591,431.

Final Office Action, Mail Date Apr. 22, 2005; U.S. Appl. No. 10/747,016.

Supplemental Notice of Allowance, Mail Date Dec. 13, 2007; U.S. Appl. No. 11/591,431.

Final Office Action, Mail Date Aug. 4, 2009; Appl. No. 10/334,918.

"High-Speed, Digitally Adjusted Stepdown Controllers for Notebook CPUS", Maxim Manual, Jul. 2000, pp. 1-28.

"Wafer Burn-In Isolation Circuit"; IBM Technical Disclosure Bulletin; IBM Corp. New York, US, vol. 32, No. 6B, Nov. 1, 1989, pp. 442-443.

"LTC 1736 Product", Linear Technology Manual, Jan. 1999, pp. 1-28.

PCT International Preliminary Examination Report, Application No. PCT/US03/41403, Oct. 1, 2005, pp. 1-10.

PCT International Search Report, Application No. PCT/US03/41403, May 10, 2004, pp. 1-8.

PCT International Preliminary Examining Authority Written Opinion, Application No. PCT/US03/41403, Aug. 10, 2004, pp. 1-9.

* cited by examiner

SERVO LOOP FOR WELL BIAS VOLTAGE SOURCE

RELATED UNITED STATES PATENT APPLICATIONS

This Continuation Application claims the benefit of the commonly-owned U.S. patent application Ser. No. 11/591,431, filed on Oct. 31, 2006, by Tien-Min Chen, and entitled "SERVO LOOP FOR WELL BIAS VOLTAGE SOURCE," now issued as a U.S. Pat. No. 7,362,165, which is a Continuation Application that claims the benefit of the commonly-owned U.S. patent application Ser. No. 10/747,015, filed on Dec. 23, 2003, by Tien-Min Chen, and entitled "SERVO LOOP FOR WELL BIAS VOLTAGE SOURCE," now issued as a U.S. Pat. No. 7,129,771, which are incorporated herein by reference in their entirety.

This application is related to U.S. patent application Ser. No. 10/747,016 by Tien-Min Chen, et al., filed on Dec. 23, 2003, entitled "Feedback Controlled Body-Bias Voltage Source," now issued as U.S. Pat. No. 7,649,402, and assigned to the assignee of the present invention.

This application is related to U.S. patent application Ser. No. 10/746,539 by Tien-Min Chen and Robert Fu, filed on Dec. 23, 2003, entitled "A Precise Control Component for a Substrate Potential Regulation Circuit," now issued as U.S. Pat. No. 7,692,477, and assigned to the assignee of the present invention.

This Application is related to U.S. patent application Ser. No. 10/747,022 by Tien-Min Chen, filed on Dec. 23, 2003, entitled "A Charge Stabilizing Component for a Substrate Potential Regulation Circuit" now issued as a U.S. Pat. No. 7,012,461, and assigned to the assignee of the present invention.

FIELD OF THE INVENTION

Embodiments of the present invention relate to circuits for providing operational voltages in complementary metal-oxide semiconductor (CMOS) circuits. In particular, embodiments of the present invention relate to control circuits for body-bias charge pumps.

BACKGROUND ART

As the operating voltages for CMOS transistor circuits have decreased, variations in the threshold voltages for the transistors have become more significant. Although low operating voltages offer the potential for reduced power consumption, threshold voltage variations due to process and environmental variables often prevent optimum efficiency and performance from being achieved due to increased leakage currents.

Prior Art FIG. 1A shows a conventional CMOS inverter 100. A P-type substrate 105 supports an NFET 110 and a PFET 120. The NFET 110 comprises a gate 112, source 113, and drain 114. The PFET 120 resides in an n-well 115, and comprises a gate 122, drain 123, and a source 124. The substrate 105 and source 113 are coupled by a tie 130 that is connected to ground (GND), while source 124 and N-well 115 are coupled by a tie 135 that is connected to a supply voltage ($V_{DD}$). The input to the inverter is applied to the gates 112 and 122, with the output taken from the drain contact 125. In this conventional configuration, the transistors are often treated as three terminal devices.

Threshold voltage variations may be compensated for by body-biasing. Body-biasing introduces a reverse bias potential between the bulk and the source of the transistor that allows the threshold voltage of the transistor to be adjusted electrically. The purpose of body-biasing is to compensate for 1) process variations; 2) temperature variations; 3) supply voltage variations; 4) changes in frequency of operation; and 5) changing levels of switching activity.

Prior Art FIG. 1B shows an inverter having connections for body-biasing. Body-bias can provided to the PFET 120 through a direct bias contact 150a, or by a buried n-well 140 using contact 150b. Similarly, body-bias may be provided to the NFET 110 by a surface contact 155a, or by a backside contact 155b. An aperture 145 may be provided in the buried n-well 125 so that the bias potential reaches the NFET 110. In general, a PFET 120 or an NFET 110 may be biased by one of the alternative contacts shown.

Depending upon the environmental and operational conditions, a CMOS circuit may require different levels of bias for the transistors. For example, a microprocessor that is executing a computationally intensive routine for a real-time application will typically be biased for maximum speed, whereas during periods of low activity the bias will be adjusted to minimize leakage current.

For a CMOS integrated circuit, the load presented to a circuit providing a body-bias voltage and the bias circuit itself may vary with the environmental and operational conditions of integrated circuit. Thus, the variations in the required body-bias voltage and the load to which it is applied should be taken into account to achieve optimum performance.

Charge pumps are frequently used in integrated circuits to provide a voltage that is larger than the voltage supplied to the integrated circuit. For example, charge pumps are used in certain types of non-volatile memory to provide operating voltages. These operating voltages are typically not subject to the close tolerances that apply to body-bias voltages for threshold voltage adjustment.

SUMMARY OF INVENTION

Thus, a need exists for a system for controlling a charge pump to provide a precise body-bias voltage for transistors in CMOS circuits.

Accordingly, embodiments of the present invention provides a system that uses a servo loop to control a charge pump to produce a desired body-bias voltage. The system accept an input reference voltage that is related to the desired output and can be configured for either NFETs or PFETs.

In an embodiment of the present invention for providing a body-bias for NFETs, the output of a negative charge pump is coupled to a current source by a variable resistor. A first input terminal of a comparator is coupled to the node between the resistor and the current source, and a second input is connected to ground. The output of the comparator is coupled to enable an input of the charge pump, and an enable input of a shunt circuit that is in parallel with a load on the output of the charge pump.

In an embodiment of the present invention for providing a body-bias for PFETs, the output of a positive charge pump is coupled to a current sink at ground by a variable resistor. A first input terminal of a comparator is coupled to a power supply $V_{dd}$ as a reference, and a second input is coupled to the node between the resistor and the current source. The output of the comparator is coupled to enable an input of the charge pump, and an enable input of a shunt circuit that is in parallel with a load on the output of the charge pump.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

DESCRIPTION OF THE PREFERRED EMBODIMENTS

In the following detailed description of the present invention, a feedback-controlled body-bias circuit, numerous specific details are set forth in order to provide a thorough understanding of the present invention. However, it will be obvious to one skilled in the art that the present invention may be practiced without these specific details. In other instances well known methods, procedures, components, and circuit elements have not been described in detail as not to unnecessarily obscure aspects of the present invention.

Figure 1A:
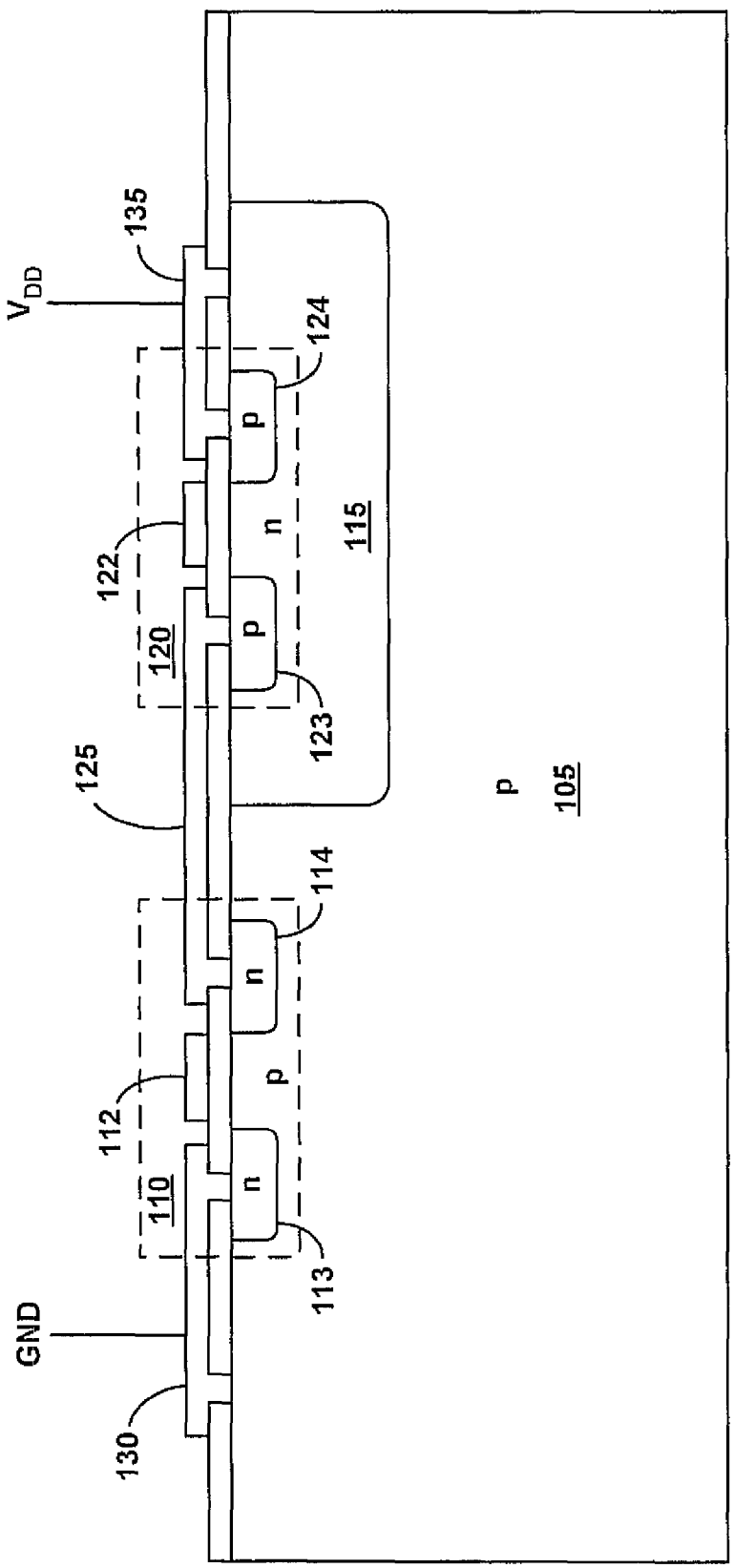
FIG. 1A shows a conventional CMOS inverter without body-bias connections.
Figure 1B:
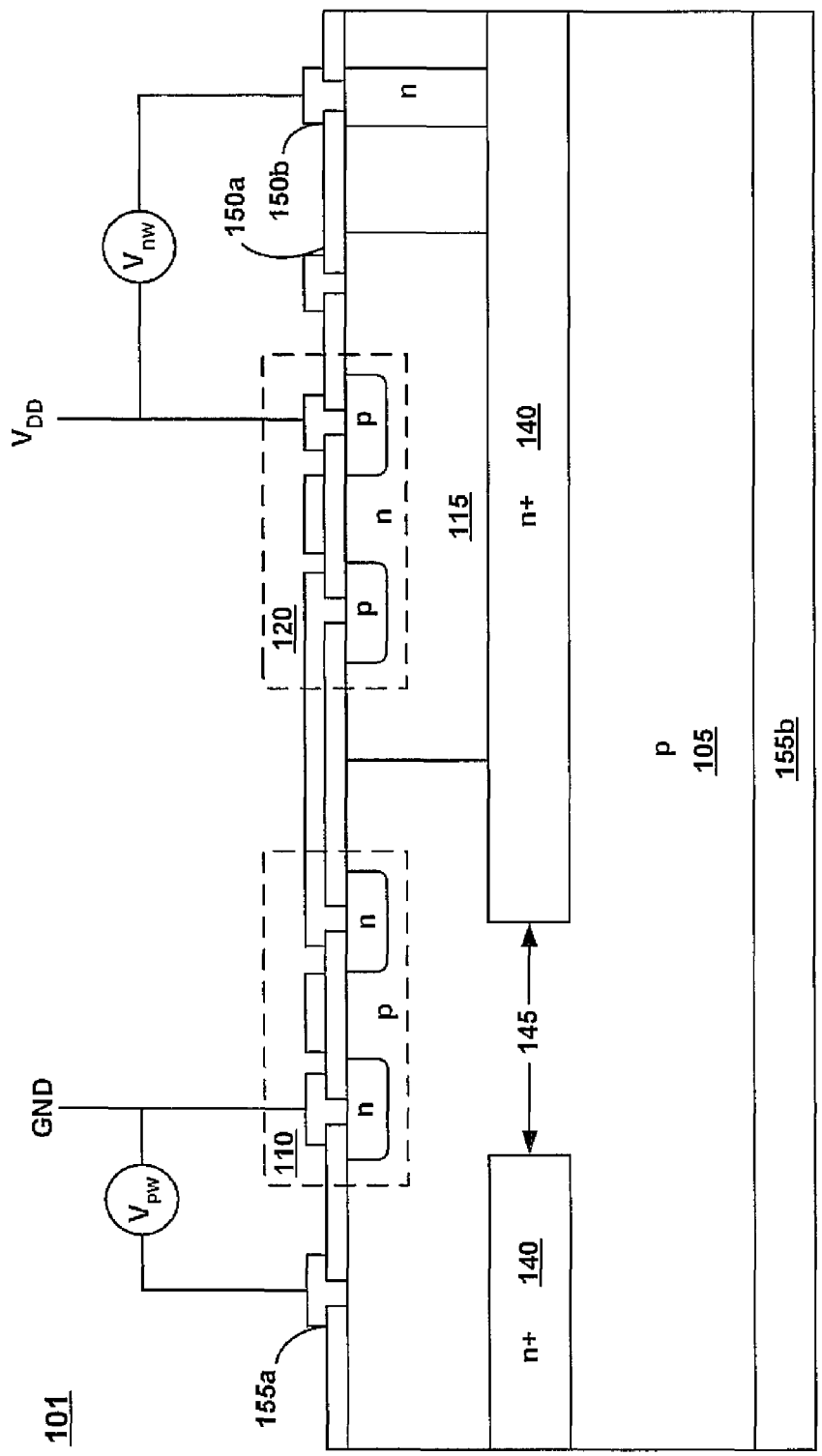
FIG. 1B shows a conventional CMOS inverter with body-bias connections.
Figure 2:
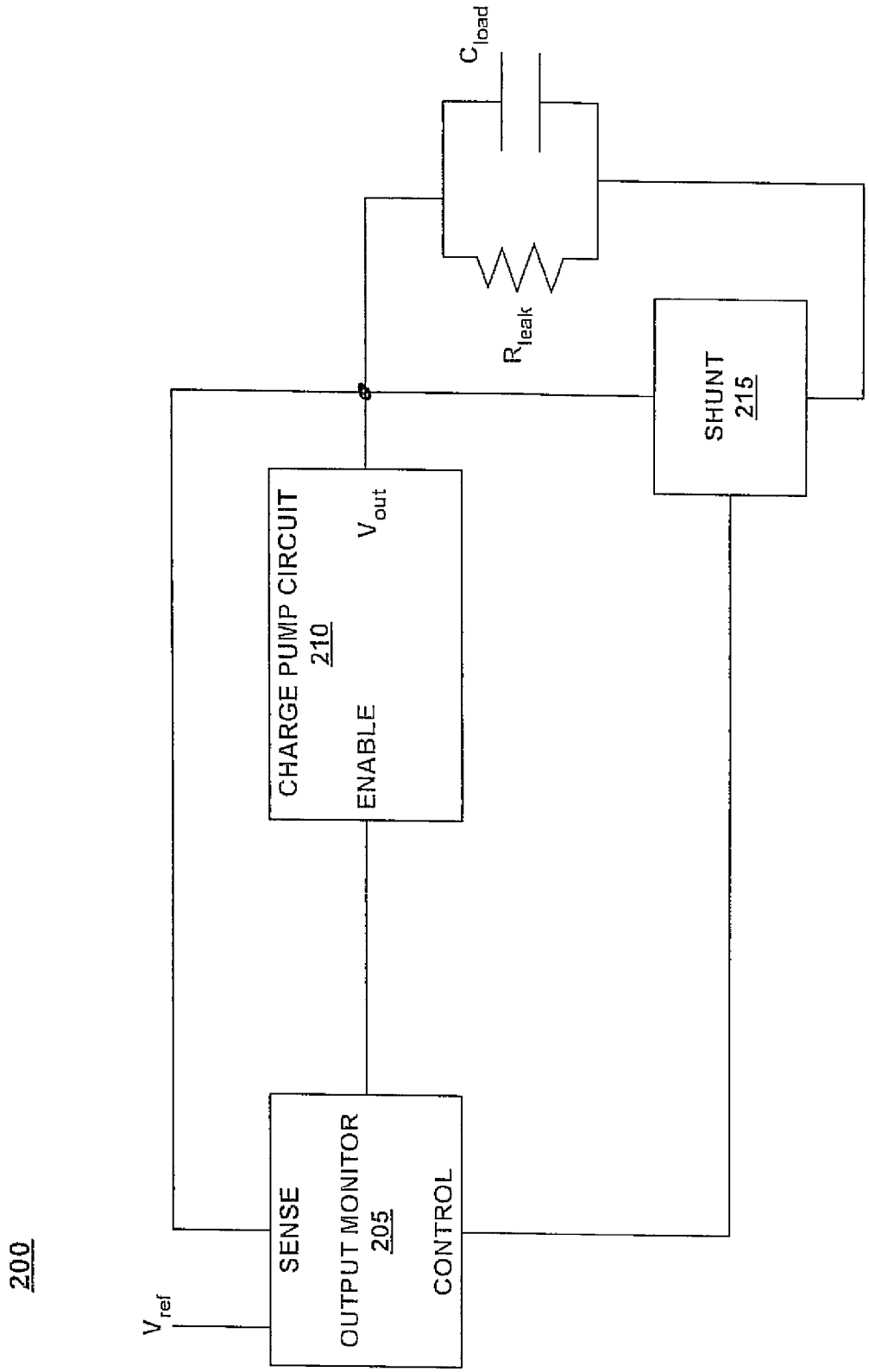
FIG. 2 shows a block diagram of a feedback controlled body-bias circuit in accordance with an embodiment of the present claimed invention.

FIG. 2 shows a block diagram 200 of an embodiment of the present invention. A charge pump 210 has an output coupled to $C_{load}$ that represents a substrate or well. Since body-bias is typically applied as a reverse bias to a p-n junction within a CMOS device, the load seen by the body-bias voltage source is generally a capacitive load, however, there is a certain amount of leakage current, represented by $R_{leak}$.

An output monitor 205 has a sense input coupled to the output of the charge pump 210. The output of the charge pump is compared to a reference voltage $V_{ref}$ by the output monitor 205. Upon sensing a positive or negative deviation (over-voltage or under-voltage) that exceeds an allowed value, the output monitor provides a control signal to the charge pump circuit 210 and/or a shunt circuit 215.

For an over-voltage condition with loads having a large $C_{load}$ and large $R_{leak}$ (small leakage current), simply turning off the charge pump may not result in a sufficiently fast discharge of $C_{load}$ to the desired value. Accordingly, the shunt 215 may be enabled to provide a discharge path that allows faster correction of the output voltage $V_{out}$. FIG. 2 is described in previously incorporated co-pending patent application entitled "Feedback Controlled Body-Bias Voltage Source."

Figure 3:
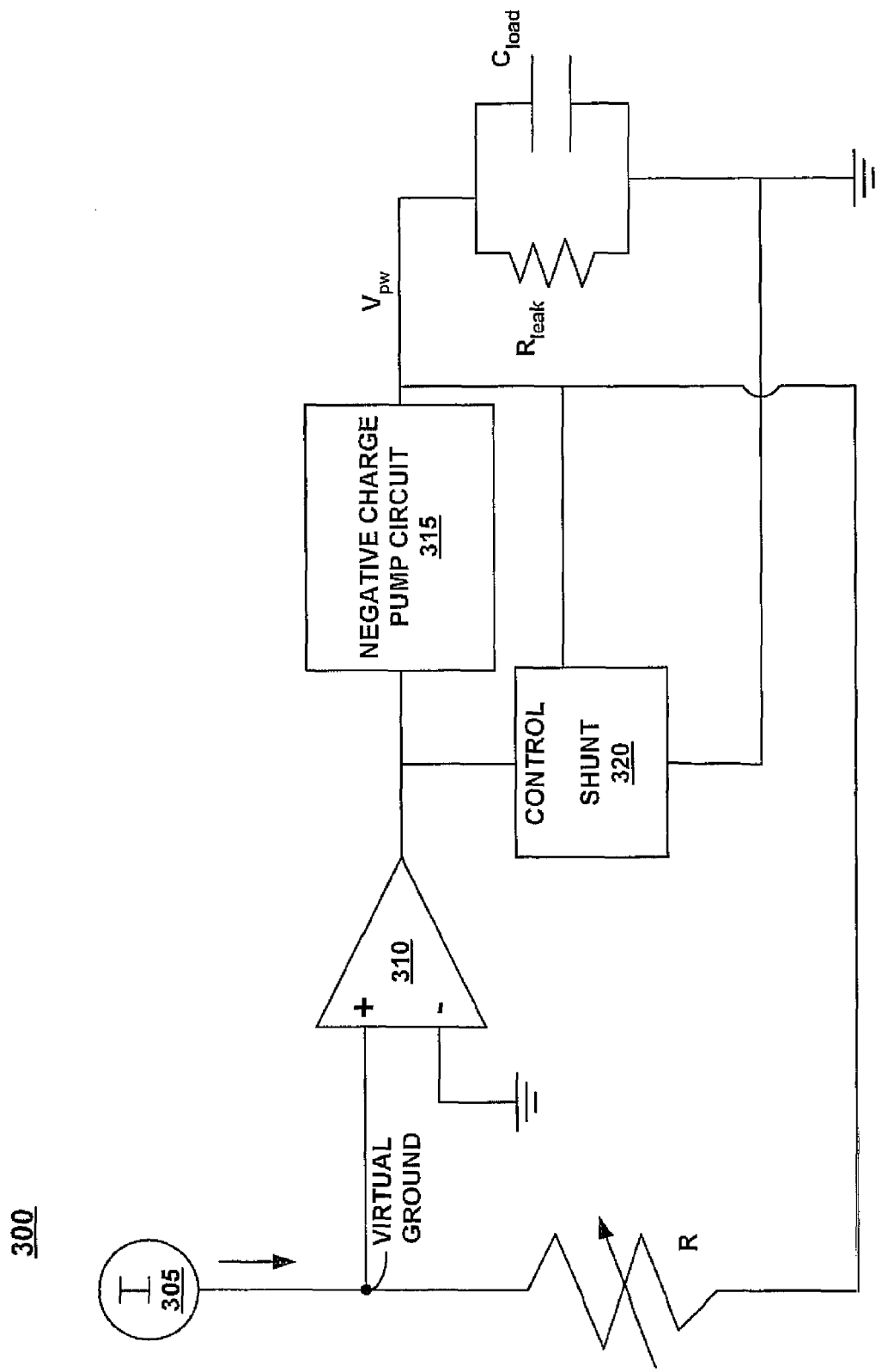
FIG. 3 shows a circuit diagram of a negative body-bias supply with a servo loop for NFETs in accordance with an embodiment of the present claimed invention.

FIG. 3 shows a circuit diagram 300 of a negative body-bias supply with a servo loop for NFETs in accordance with an embodiment of the present invention. The current source 305 is coupled to the output of the negative charge pump circuit 315 by a variable resistor R. An equivalent load circuit is shown having an $R_{leak}$ in parallel with a $C_{load}$. The negative charge pump circuit 315 and shunt 320 have enable inputs coupled to the output of comparator 310.

The variable resistor R, Shunt 320, comparator 310 and current source 305 are elements of the servo loop that controls the voltage $V_{pw}$ at the output of the charge pump 315. The basic servo loop feedback is provided by the comparator. Vpw is equal to −IR with respect to the virtual ground at the (+) input of the comparator 310. In a particular embodiment, I is preferably about 10 microamperes.

Figure 4:
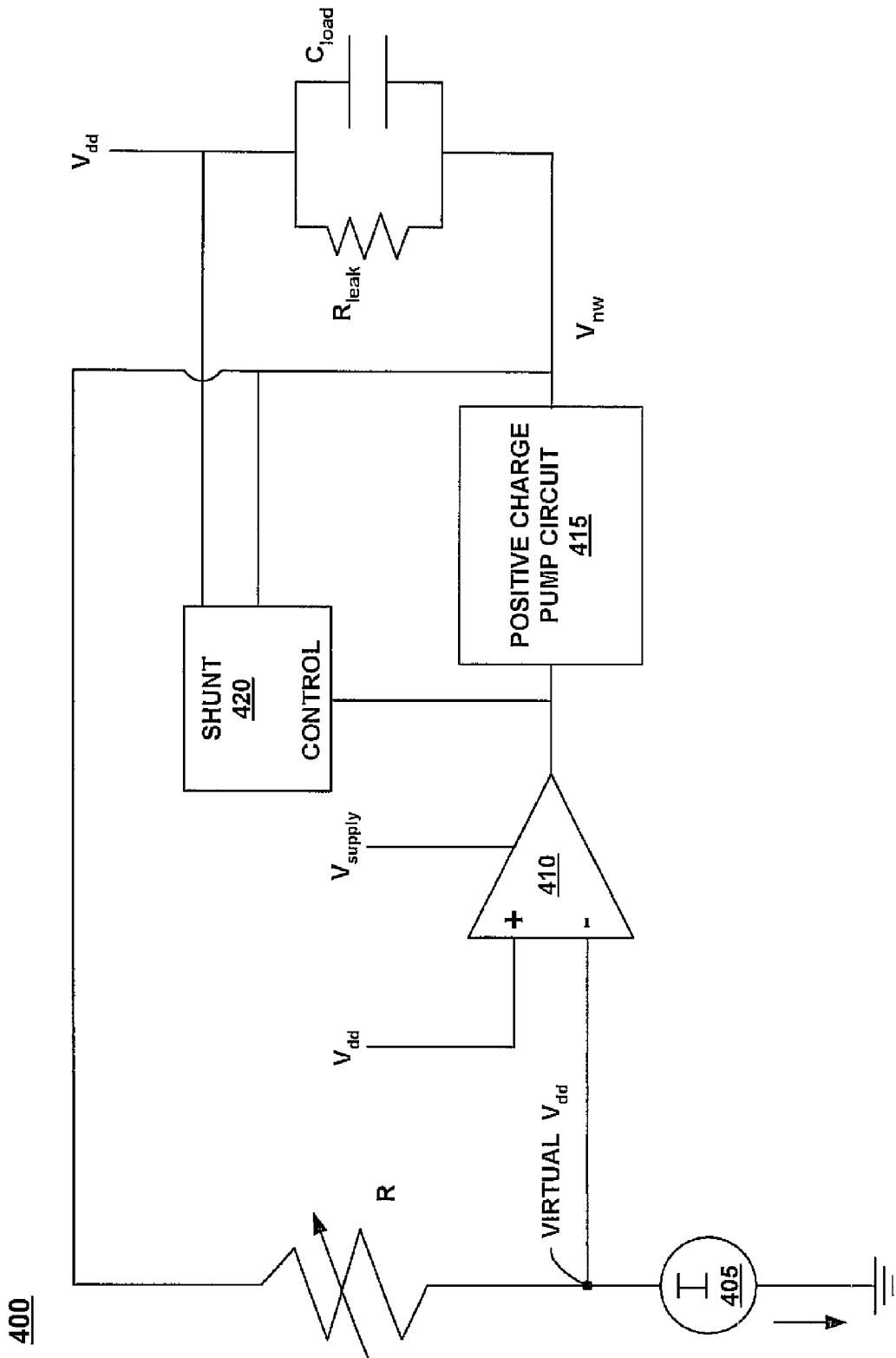
FIG. 4 shows a circuit diagram of a positive body-bias supply with a servo loop for PFETs in accordance with an embodiment of the present claimed invention.

The magnitude of the voltage drop IR may be adjusted by adjusting the variable resistor R. A description of the variable resistor R shown in FIG. 3 and FIG. 4 is provided in the previously incorporated co-pending patent application entitled "A Precise Control Component for a Substrate Potential Regulation Circuit."

When the virtual ground potential at the (+) input is above the reference ground potential at the (−) input of the comparator 310, the comparator output is high, enabling the negative charge pump 315 and disabling the shunt 320. With the charge pump on, $V_{pw}$ is forced lower.

In order to lower $V_{pw}$, the charge pump 315 must be able to sink a current that is greater than the output of the current source 305. For sufficiently large values of $R_{leak}$, $V_{pw}$ may tend to rise due to charging of $C_{load}$ by the current source 305 when the charge pump 315 is off.

Due to the action of the charge pump 315, the virtual ground potential will drop until the virtual ground potential is slightly below the reference ground potential. At this point the comparator output is switched low and the charge pump 315 is disabled and the shunt is enabled. The enabling of the shunt reduces the voltage across $C_{load}$.

Although the potential across $C_{load}$ will tend to drop when the charge pump is turned off due to the presence of $R_{leak}$, The shunt provides a faster forced response. The servo loop produces a cycling behavior to maintain $V_{pw}$ at −IR, in which the charge pump and shunt are alternately enabled and disabled.

In one embodiment, the comparator 315 may be designed with a hysteresis characteristic to provide a dead-band in which neither the charge pump or shunt are enabled. Alternatively, the shunt 320 may be designed with a delay at the enable input.

In one embodiment, the current source 305 sources a current of about 10 microamperes and the shunt 320 and charge pump 315 are cycled at a frequency of about 40 MHz when coupled to a $C_{load}$ of less than 100 nanofarads (e.g., about 75 nanofarads).

FIG. 4 shows a circuit diagram 400 of a positive body-bias supply with a servo loop for PFETs in accordance with an embodiment of the present invention. A current sink 405 is coupled to the output of the negative charge pump circuit 415 by a variable resistor R. An equivalent load circuit is shown having an $R_{leak}$ in parallel with a $C_{load}$. The positive charge pump circuit 415 and shunt 420 have enable inputs coupled to the output of comparator 310.

The variable resistor R, Shunt 420, comparator 410 and current sink (negative source) 405 are the elements making up the servo loop that controls the voltage $V_{nw}$ at the output of the charge pump 415. Vnw is equal to $V_{dd}$+IR with respect to ground. In a particular embodiment, I is preferably about 10 microamperes.

The comparator 410 has $V_{supply}$ that limits the available range of $V_{dd}$. For example, if $V_{supply}$ is equal to about 2.5 volts, the available range of $V_{dd}$ is about 0.6 volts to 1.6 volts. In order to maximize the common mode input range of comparator 410 it is preferable to use a comparator that employs both PFETs and NFETs in its input stage.

When the virtual $V_{dd}$ potential at the (−) input is below the reference $V_{dd}$ potential at the (+) input of the comparator 410, the comparator output is high, enabling the positive charge pump 415 and disabling the shunt 420. With the charge pump on, $V_{nw}$ is forced higher.

Due to the action of the charge pump 415, $V_{nw}$ will rise until the virtual $V_{dd}$ potential is slightly above the reference $V_{dd}$ potential. At this point the comparator output is switched low and the charge pump 415 is disabled and the shunt is enabled. The enabling of the shunt reduces the voltage across $C_{load}$.

Although the potential across $C_{load}$ will tend to drop when the charge pump is turned off due to the presence of $R_{leak}$, The shunt provides a faster forced response. The servo loop produces a cycling behavior to maintain $V_{nw}$ at $V_{dd}$+IR, in which the charge pump and shunt are alternately enabled and disabled.

In one embodiment, the comparator 415 may be designed with a hysteresis characteristic to provide a dead-band in which neither the charge pump or shunt are enabled. Alternatively, the shunt 420 may be designed with a delay at the enable input.

Descriptions of the variable resistor R and shunt (320, 420) shown in FIG. 3 and FIG. 4 are provided in the previously incorporated co-pending patent applications entitled "A Precise Control Component for a Substrate Potential Regulation Circuit" and "A Charge Stabilizing Component for a Substrate Potential Regulation Circuit."

Figure 5A:
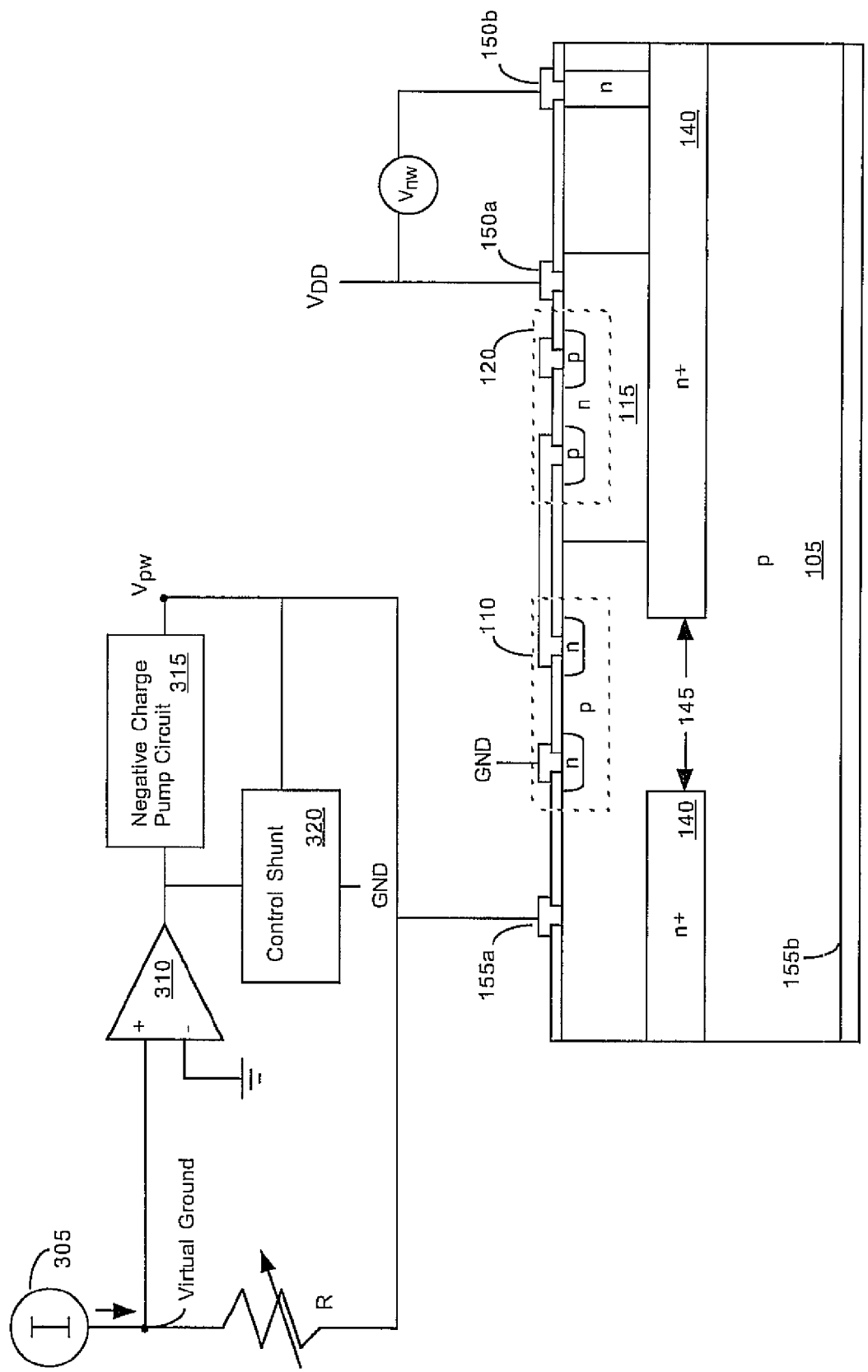
FIG. 5A shows a circuit diagram of a servo loop with a negative body-bias supply applied to an NFET in accordance with an embodiment of the present claimed invention.

FIG. 5A shows a circuit diagram of a servo loop with a negative body-bias supply used to reverse-bias a p-n junction in a CMOS device in accordance with an embodiment of the present claimed invention.

Figure 5B:
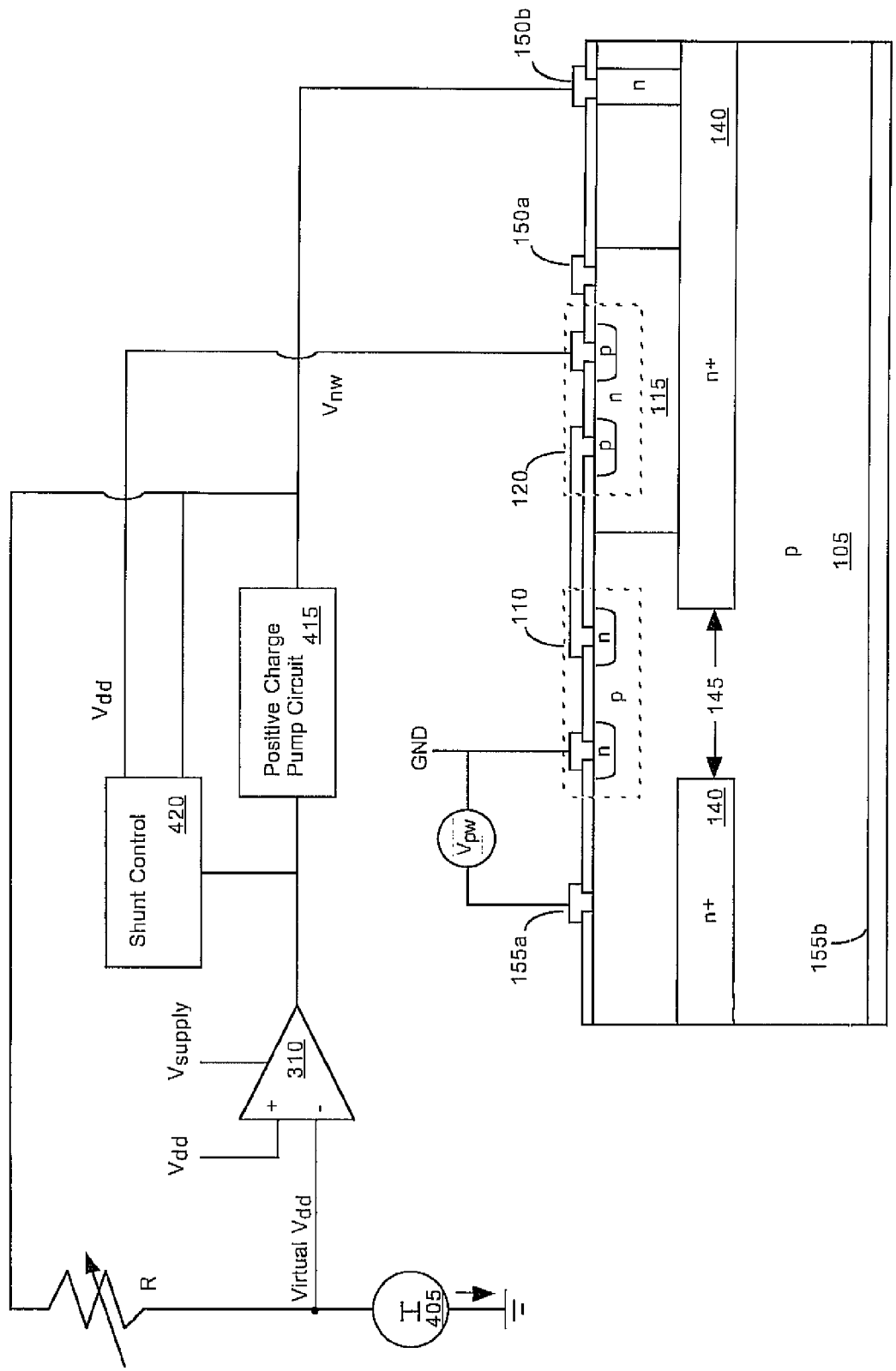
FIG. 5B shows a circuit diagram of a servo loop with a positive body-bias supply applied to a PFET in accordance with an embodiment of the present claimed invention.

FIG. 5B shows a circuit diagram of a servo loop with a positive body-bias supply used to reverse-bias a p-n junction in a CMOS device in accordance with an embodiment of the present claimed invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, an integrated circuit having a P-type substrate and an N-well disposed therein is described. More generally, the invention may be used with a semiconductor substrate of either N-type or P-type having a complementary well disposed therein. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A circuit comprising:
   a charge provider circuit operable to receive a control signal and operable to provide a charge to a body-bias voltage source of an integrated circuit responsive to said control signal;
   an output monitoring circuit operable to determine, independently of said control signal, whether a voltage at an output node of said charge provider circuit is an over-voltage or an under-voltage that is outside of an acceptable threshold value, wherein said output monitoring circuit is operable, independently of an external signal, to outputs said control signal which is operable to adjust said output node responsive to said determination; and
   a shunt circuit operable to provide a discharge path responsive to said control signal based on whether said voltage at said output node exceeds said acceptable threshold value,
   wherein said control signal causes said charge provider circuit to provide said charge to said body-bias voltage source based on whether said voltage at said output node is outside of said acceptable threshold value.

2. The circuit of claim 1, wherein said charge provider circuit is a charge pump, and wherein said charge pump is coupled to a substrate.

3. The circuit of claim 1, wherein said shunt circuit comprises an enable input delay.

4. The circuit of claim 1, wherein said output monitoring circuit comprises a comparator.

5. The circuit of claim 1, wherein said output monitoring circuit comprises both NFETs and PFETs in an input stage.

6. The circuit of claim 1, wherein said output of said output monitoring circuit is coupled to said charge provider circuit.

7. A voltage source comprising:
   a negative charge provider circuit operable to receive a control signal and operable to provide a negative charge to a body-bias voltage source for an integrated circuit responsive to said control signal;
   a comparator operable to determine, independently of said control signal, whether a first voltage at a first input is greater than a reference voltage at a second input, wherein said first voltage is dependent on an output voltage at an output node of said negative charge provider circuit, wherein said comparator is operable, independently of an external signal, to output said control signal in response to said determination, and wherein a voltage of said body-bias voltage source is increased or decreased responsive to said control signal; and
   a shunt circuit coupled to an output of said comparator.

8. The voltage source of claim 7, wherein said negative charge provider circuit comprises a negative charge pump, and further comprising:
   a current source coupled to said first input; and
   a variable resistor coupled between said current source and said negative charge pump, and
   wherein said negative charge pump is coupled to a substrate.

9. The voltage source of claim 7, wherein said shunt circuit is also coupled to said negative charge provider circuit, and wherein said shunt circuit is operable to control said output voltage of said negative charge provider circuit responsive to said control signal.

10. The voltage source of claim 9, wherein said shunt circuit is disabled if said negative charge provider circuit is enabled.

11. The voltage source of claim 9, wherein said shunt circuit is operable to reduces said output voltage of said negative charge provider circuit.

12. The voltage source of claim 9, wherein said shunt circuit is operable to provides increased response time of said output voltage.

13. The voltage source of claim 9, wherein said shunt circuit is enabled if said negative charge provider circuit is disabled.

14. The voltage source of claim 9, wherein said shunt circuit comprises a delay at an enable input.

15. The voltage source of claim 7, wherein said output node of said negative charge provider circuit is coupled to a load comprising a reverse-biased p-n junction.

16. A voltage source comprising:
a positive charge provider circuit operable to receive a control signal and operable to provide a positive charge to a body-bias voltage source for an integrated circuit responsive to said control signal;
a comparator operable to determine, independently of said control signal, whether a voltage of an input signal is lower than a reference voltage, wherein said voltage of said input signal is dependent on an output voltage at an output node of said positive charge provider circuit, wherein said comparator is operable, independently of an external signal, to outputs said control signal in response to said determination, and wherein a voltage of said body-bias voltage source is increased or decreased responsive to said control signal; and
a shunt circuit coupled to an output of said comparator.

17. The voltage source of claim 16, wherein said positive charge provider circuit comprises a positive charge pump, and further comprising:
a current sink; and
a variable resistor coupled to said current sink, wherein said variable resistor and said current sink are operable to control an output voltage of said positive charge pump, and
wherein said positive charge pump is coupled to a substrate.

18. The voltage source of claim 16, wherein said shunt circuit is also coupled to said positive charge provider circuit, and wherein said shunt circuit is operable to control said output voltage of said positive charge provider circuit responsive to said control signal.

19. The voltage source of claim 18, wherein said shunt circuit is disabled if said positive charge provider circuit is enabled.

20. The voltage source of claim 18, wherein said shunt circuit is operable to reduces said output voltage of said positive charge provider circuit.

21. The voltage source of claim 18, wherein said shunt circuit is operable to provides increased response time of said output voltage.

22. The voltage source of claim 18, wherein said shunt circuit is enabled if said positive charge provider circuit is disabled.

23. The voltage source of claim 18, wherein said shunt circuit comprises a delay at an enable input.

24. The voltage source of claim 16, wherein said comparator comprises both NFETs and PFETs in an input stage.

25. The voltage source of claim 16, wherein said output node of said positive charge provider circuit is coupled to a load comprising a reverse-biased p-n junction.

26. A circuit comprising:
means for providing a charge to a body-bias voltage source of an integrated circuit responsive to a control signal, wherein said means for providing receives said control signal;
means for determining, independently of said control signal, whether a voltage at an output node of said means for providing said charge is an over-voltage or an under-voltage that is outside of an acceptable threshold value, wherein said means for determining, independently of an external signal, outputs said control signal which is operable to adjust said output node responsive to said determination, and wherein said control signal causes said means for providing said charge to provide said charge to said body-bias voltage source based on whether said voltage at said output node is outside of said acceptable threshold value; and
means for providing a discharge path responsive to said control signal based on whether said voltage at said output node exceeds said acceptable threshold value.

27. The circuit of claim 26, wherein said means for providing said charge is a charge pump, and wherein said charge pump is coupled to a substrate.

28. The circuit of claim 26, wherein said means for providing said discharge path comprises an enable input delay.

29. The circuit of claim 26, wherein said means for determining comprises means for comparing.

30. The circuit of claim 26, wherein said means for determining comprises both NFETs and PFETs in an input stage.

31. The circuit of claim 26, wherein an output of said means for determining is coupled to said means for providing said charge.

\* \* \* \* \*

UNITED STATES PATENT AND TRADEMARK OFFICE
CERTIFICATE OF CORRECTION

| | |
|---|---|
| PATENT NO. | : 7,847,619 B1 |
| APPLICATION NO. | : 12/107733 |
| DATED | : December 7, 2010 |
| INVENTOR(S) | : Chen |

It is certified that error appears in the above-identified patent and that said Letters Patent is hereby corrected as shown below:

Title page, under "Primary Examiner", in Column 2, Line 1, delete "Sweizig" and insert -- Zweizig --.

Title Page 4, item (56), under "Other Publications", in Column 1, Line 11, delete "IICMTS" and insert -- ICMTS --.

In Drawing Figure 5B, Line 4, below "$V_{supply}$" delete "310" and insert -- 410 --.

Column 1, line 21, delete "Source." and insert -- Source, --.

Column 4, line 10, delete "Vpw" and insert -- $V_{pw}$ --.

Column 4, line 40, delete "comparator 315" and insert -- comparator 310 --.

Column 4, line 57, delete "comparator 310." and insert -- comparator 410. --.

Column 4, line 61, delete "Vnw" and insert -- $V_{nw}$ --.

Column 5, line 20, delete "comparator 415" and insert -- comparator 410 --.

Column 6, line 1, in Claim 1, delete "outputs" and insert -- output --.

Column 6, line 55, in Claim 11, delete "reduces" and insert -- reduce --.

Column 6, line 58, in Claim 12, delete "provides" and insert -- provide --.

Column 7, line 12, in Claim 16, delete "outputs" and insert -- output --.

Column 7, line 36, in Claim 20, delete "reduces" and insert -- reduce --.

Signed and Sealed this
Twenty-fourth Day of July, 2012

David J. Kappos
*Director of the United States Patent and Trademark Office*

Column 7, line 39, in Claim 21, delete "provides" and insert -- provide --.

Column 8, line 19, in Claim 26, delete "outputs" and insert -- to output --.